(12) United States Patent
Sung et al.

(10) Patent No.: US 9,530,728 B2
(45) Date of Patent: Dec. 27, 2016

(54) SEMICONDUCTOR DEVICES AND METHODS OF MANUFACTURE THEREOF

(71) Applicant: Taiwan Semiconductor Manufacturing Company, Ltd., Hsin-Chu (TW)

(72) Inventors: Su-Jen Sung, Zhubei (TW); Yi-Nien Su, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/845,977

(22) Filed: Sep. 4, 2015

(65) Prior Publication Data

US 2015/0380352 A1 Dec. 31, 2015

Related U.S. Application Data

(62) Division of application No. 13/890,148, filed on May 8, 2013, now Pat. No. 9,129,965.

(60) Provisional application No. 61/785,366, filed on Mar. 14, 2013.

(51) Int. Cl.
| | |
|---|---|
| *H01L 21/76* | (2006.01) |
| *H01L 23/522* | (2006.01) |
| *H01L 23/528* | (2006.01) |
| *H01L 23/532* | (2006.01) |
| *H01L 21/311* | (2006.01) |
| *H01L 21/768* | (2006.01) |
| *H01L 21/66* | (2006.01) |

(52) U.S. Cl.
CPC ..... *H01L 23/5226* (2013.01); *H01L 21/31116* (2013.01); *H01L 21/76802* (2013.01); *H01L 21/76807* (2013.01); *H01L 21/76829* (2013.01); *H01L 21/76832* (2013.01); *H01L 21/76834* (2013.01); *H01L 23/528* (2013.01); *H01L 23/5329* (2013.01); *H01L 23/53238* (2013.01); *H01L 23/53295* (2013.01); *H01L 22/26* (2013.01); *H01L 2924/0002* (2013.01)

(58) Field of Classification Search
USPC ........................................................ 257/774
See application file for complete search history.

(56) References Cited

U.S. PATENT DOCUMENTS

| | | | |
|---|---|---|---|
| 6,133,144 A | 10/2000 | Tsai et al. | |
| 6,265,319 B1 * | 7/2001 | Jang ................. | H01L 21/76807 257/E21.579 |
| 6,323,121 B1 * | 11/2001 | Liu ................... | H01L 21/02063 257/E21.226 |
| 6,445,051 B1 | 9/2002 | Chang et al. | |

(Continued)

FOREIGN PATENT DOCUMENTS

CN 102623396 A 8/2012

*Primary Examiner* — Thao P Le
(74) *Attorney, Agent, or Firm* — Slater Matsil, LLP

(57) ABSTRACT

Semiconductor devices and methods of manufacture thereof are disclosed. In some embodiments, a method of manufacturing a semiconductor device includes forming an etch stop layer over a workpiece. The etch stop layer has an etch selectivity to a material layer of the workpiece of greater than about 4 to about 30. The method includes forming an insulating material layer over the etch stop layer, and patterning the insulating material layer using the etch stop layer as an etch stop.

20 Claims, 6 Drawing Sheets

(56) References Cited

U.S. PATENT DOCUMENTS

| | | | |
|---|---|---|---|
| 6,713,873 B1* | 3/2004 | O'Loughlin | H01L 21/3141 257/753 |
| 7,151,001 B2 | 12/2006 | Kim et al. | |
| 7,196,008 B1 | 3/2007 | Shiraiwa et al. | |
| 2003/0008490 A1* | 1/2003 | Xing | H01L 21/31144 438/622 |
| 2003/0127677 A1 | 7/2003 | Park et al. | |
| 2003/0153146 A1 | 8/2003 | Won et al. | |
| 2006/0084275 A1* | 4/2006 | You | H01L 21/31116 438/704 |
| 2007/0059913 A1* | 3/2007 | King | H01L 21/76832 438/597 |
| 2007/0232048 A1* | 10/2007 | Miyata | H01L 21/31116 438/597 |
| 2010/0227449 A1 | 9/2010 | Kim et al. | |
| 2012/0119283 A1 | 5/2012 | Lee et al. | |
| 2013/0273742 A1 | 10/2013 | Yang et al. | |

\* cited by examiner

SEMICONDUCTOR DEVICES AND METHODS OF MANUFACTURE THEREOF

This application is a divisional application of U.S. patent application Ser. No. 13/890,148, entitled "Semiconductor Devices and Methods of Manufacture Thereof," filed on May 8, 2013, which claims the benefit of U.S. Provisional Application No. 61/785,366, entitled "Semiconductor Devices and Methods of Manufacture Thereof," filed on Mar. 14, 2013, which applications are incorporated herein by reference.

BACKGROUND

Semiconductor devices are used in a variety of electronic applications, such as personal computers, cell phones, digital cameras, and other electronic equipment, as examples. Semiconductor devices are typically manufactured by providing a workpiece, forming various material layers over the workpiece, and patterning the various material layers using lithography to form integrated circuits.

The semiconductor industry continues to improve the integration density of various electronic components of integrated circuits, i.e., transistors, diodes, resistors, capacitors, etc., by continual reductions in minimum feature size, which allow more components to be integrated into a given area.

Conductive materials such as metals or semiconductors are used in semiconductor devices for making electrical connections for the integrated circuits. For many years, aluminum was used as a metal for conductive materials for electrical connections, and silicon dioxide was used as an insulator. However, as devices are decreased in size, the materials for conductors and insulators have changed, to improve device performance. Copper is now often used as a conductive material for interconnects in some applications. Low dielectric constant (k) materials and extra-low k (ELK) materials that have dielectric constants less than that of silicon dioxide have begun to be implemented in some designs as insulating materials between interconnects.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of some of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Some embodiments of the present disclosure are related to manufacturing methods and structures for semiconductor devices. Novel semiconductor devices and methods of manufacture thereof will be described herein that include etch stop layers having a high etch selectivity. The etch stop layers are implementable at the bottom of vias, trenches, and other semiconductor device structures.

Figure 1:
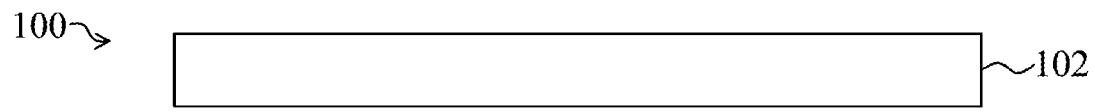
FIGS. 1 through 6 illustrate cross-sectional views of a semiconductor device at various stages of manufacturing in accordance with some embodiments of the present disclosure.

FIGS. 1 through 6 illustrate cross-sectional views of a semiconductor device 100 at various stages of manufacturing in accordance with some embodiments of the present disclosure. Referring first to FIG. 1, there is shown a cross-sectional view of a semiconductor device 100. To manufacture the semiconductor device 100, a workpiece 102 is provided. The workpiece 102 may include a semiconductor substrate comprising silicon or other semiconductor materials and may be covered by an insulating layer, for example. The workpiece 102 may also include other active components or circuits, not shown. The workpiece 102 may comprise silicon oxide over single-crystal silicon, for example. The workpiece 102 may include other conductive layers or other semiconductor elements, e.g., transistors, diodes, etc. Compound semiconductors, GaAs, InP, Si/Ge, or SiC, as examples, may be used in place of silicon. The workpiece 102 may comprise a silicon-on-insulator (SOI) or a germanium-on-insulator (GOI) substrate, as examples.

Figure 2:
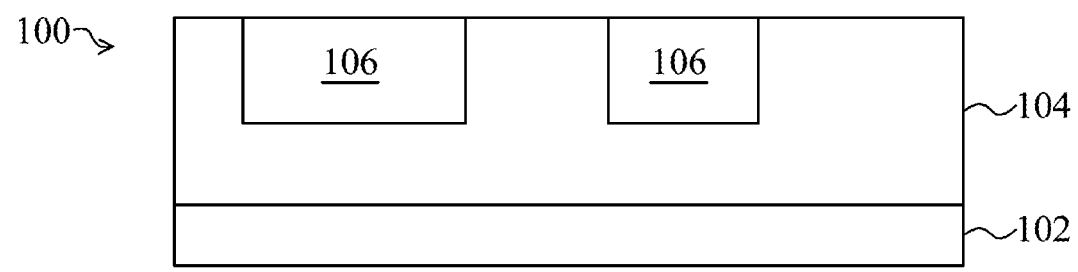

An insulating material layer 104 is deposited or formed over the workpiece 102, as shown in FIG. 2. The insulating material layer 104 comprises a dielectric material such as silicon dioxide, silicon nitride, other insulators, or combinations thereof having a thickness of about 80 nm to about 300 nm, as examples. In some embodiments, the insulating material layer 104 comprises a low dielectric constant (k) material having a dielectric constant or k value of less than about 3.9, which is the dielectric constant of silicon dioxide, for example. In other embodiments, the insulating material layer 104 comprises an extreme low k (ELK) material having a k value of less than about 2.5, as another example. The insulating material layer 104 may be formed by chemical vapor deposition (CVD), a spin-on method, or physical vapor deposition (PVD), as examples. Alternatively, the insulating material layer 104 may comprise other materials and dimensions, and may be formed using other methods.

Conductive features 106 are formed in the insulating material layer 104, as shown in FIG. 2. The conductive features 106 comprise conductive lines or conductive plugs in some embodiments, for example. The conductive features 106 may be formed using a damascene technique or a subtractive etch technique, as examples. The conductive features 106 comprise copper, a copper alloy, other metals, or multiple layers or combinations thereof in some embodiments. Alternatively, the conductive features 106 may comprise other materials and may be formed using other methods.

Figure 3:
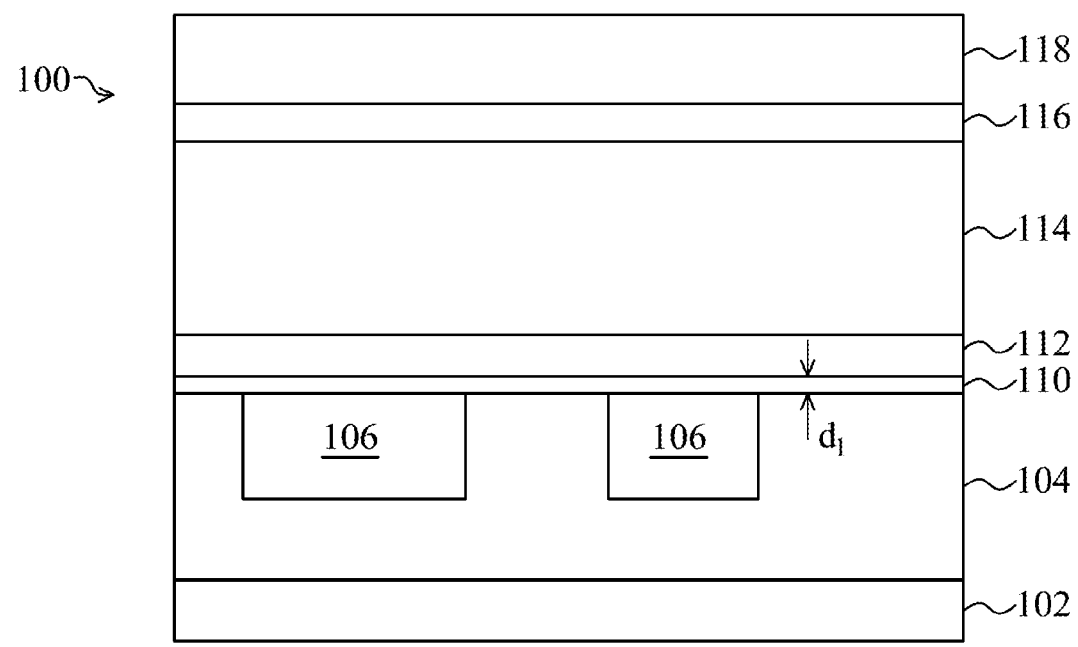

An etch stop layer 110 is formed over the insulating material layer 104 and conductive features 106, as shown in FIG. 3. The etch stop layer 110 comprises a high selectivity etch stop layer in accordance with some embodiments. The etch stop layer 110 has an etch selectivity to a material layer of the workpiece 104 of greater than about 4 to about 30 in some embodiments. For example, the etch stop layer 110 has an etch selectivity to the insulating material layer 104 of greater than about 4 to about 30 in some embodiments. In other embodiments, the etch stop layer 110 has an etch selectivity to a subsequently deposited insulating material layer 114 (which is also shown in FIG. 3) of greater than about 4 to about 30. In yet other embodiments, the etch stop layer 110 has an etch selectivity to a subsequently deposited insulating material layer 124 of greater than about 4 to about 30 (not shown; see FIG. 8). In the embodiments shown in FIGS. 1 through 6, the etch stop layer 110 has an etch selectivity to insulating material layer 104 and/or insulating material layer 114 that comprise ELK materials of about 4 to about 30, for example.

The terms "first", "second", and "third" are used herein with respect to the various insulating material layers 104, 114, and 124, e.g., in some of the claims, in the order of introduction into the claims and/or the semiconductor device 100 structure.

The term "etch selectivity" used herein refers to the (etch rate of insulating material layer 104, 114, or 124)/(etch rate of the etch stop layer 110 or 112). For example, an etch selectivity of about 10 would result in insulating material layer 104 or 114 being removed during an etch process at a rate that is about 10 times faster than the etch stop layer 110 is removed during the etch process: the etch rate ratio is 10/1, which is equal to an etch selectivity of about 10.

The etch stop layer 110 may be formed using CVD, PVD, or other methods. The etch stop layer 110 comprises a thickness comprising dimension $d_1$ of about 100 Angstroms (Å) or less in some embodiments. In the embodiments shown in FIGS. 1 through 6, the etch stop layer 110 comprises a thickness of about 5 Å to about 100 Å, for example. The etch stop layer 110 comprises an insulating material comprising Al, Ti, Ta, Mn, O, N, or combinations thereof in some embodiments, for example. In some embodiments, the etch stop layer 110 comprises a metal compound, wherein the metal compound comprises a metal oxide, a metal nitride, a metal carbide, a metal boride, or a combination of two or more thereof. The metal compound comprises one or more metal elements selected from ruthenium (Ru), nickel (Ni), cobalt (Co), chromium (Cr), iron (Fe), manganese (Mn), titanium (Ti), aluminum (Al), hafnium (Hf), tantalum (Ta), tungsten (W), vanadium (V), molybdenum (Mo), palladium (Pd), or silver (Ag). Alternatively, the etch stop layer 110 may comprise other dimensions and materials.

An etch stop layer 112 is formed over the etch stop layer 110, also shown in FIG. 3. The etch stop layer 112 comprises a different material than etch stop layer 110 in some embodiments. The etch stop layer 112 comprises a material having different properties than etch stop layer 110 in other embodiments, for example. Etch stop layer 112 has a different etch selectivity to a material layer of the workpiece 102 such as insulating material layers 104 and 114 than etch stop layer 110. Etch stop layer 112 has a lower etch selectivity to a material layer of the workpiece 102 such as insulating material layers 104 and 114 (and also 124 shown in FIG. 8) than etch stop layer 110 in some embodiments. Etch stop layer 112 has an etch selectivity to a material layer of the workpiece 102 such as insulating material layers 104 and 114 of about 1.5 to about 4 in some embodiments, for example. In other embodiments, the etch stop layer 112 has an etch selectivity to a material layer of the workpiece 102 of about 4 or less, for example.

In some embodiments, etch stop layer 110 comprises a first etch stop layer 110, and etch stop layer 112 comprises a second etch stop layer 112, for example. The first etch stop layer 110 has a first etch selectivity, and the second etch stop layer 112 has a second etch selectivity, the first etch selectivity being greater than the second etch selectivity. The first etch selectivity is greater than the second etch selectivity by about 10 or more in some applications, for example. The terms "first", "second", and "third" are used herein with respect to the various etch stop layers 110 and 112, e.g., in some of the claims, in the order of introduction into the claims and/or the semiconductor device 100 structure.

The etch stop layer 112 may be formed using CVD, PVD, or other methods. The etch stop layer 112 comprises a thickness of about 1,000 Å or less in some embodiments. In the embodiments shown in FIGS. 1 through 6, the etch stop layer 112 comprises a thickness of about 10 Å to about 500 Å, for example. The etch stop layer 112 comprises an insulating material comprising Si, C, N, O, H, or combinations thereof in some embodiments, for example. The etch stop layer 112 comprises a silicon compound. In some embodiments, the silicon compound comprises silicon oxide, a silicon nitride, a silicon carbide, a silicon boride, other materials, or multiple layers or combinations thereof. The etch stop layer 112 comprises a conventional etch stop material comprised of SiC or SiN in some embodiments, for example. Alternatively, the etch stop layer 112 may comprise other dimensions and materials.

An insulating material layer 114 is then formed over the etch stop layer 112, as shown in FIG. 3. The insulating material layer 114 comprises a similar material and dimension and is deposited by a similar method as described for insulating material layer 104, for example. The insulating material layer 114 may comprise the same material as insulating material layer 104, or the insulating material layer 114 may comprise a different material than insulating material layer 104.

A hard mask 116 is formed over insulating material layer 114. The hard mask 116 may comprise silicon nitride, silicon oxynitride, silicon dioxide, or other insulating materials, as examples. The hard mask 116 comprises a thickness of about 10 nm to about 40 nm and is deposited by CVD or PVD, as examples. The hard mask 116 may comprise a material with a greater structural strength than insulating material layer 114, which comprises an ELK material in some embodiments, for example. Alternatively, the hard mask 116 may comprise other materials and dimensions, and may be formed using other methods. The hard mask 116 is not included in some embodiments, to be described further herein.

Figure 4:
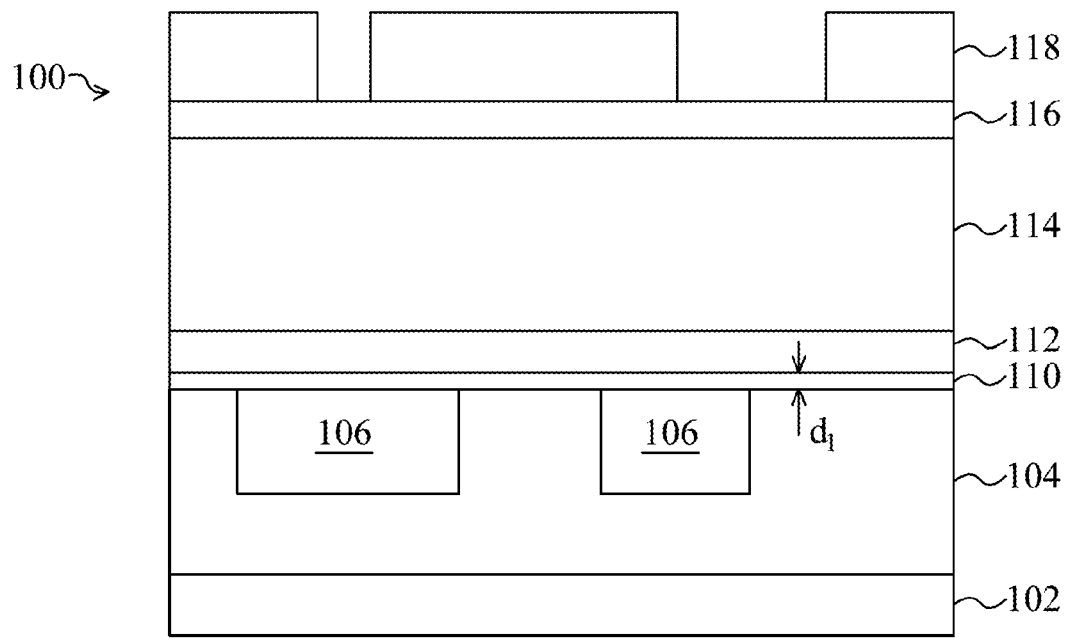
Figure 5:
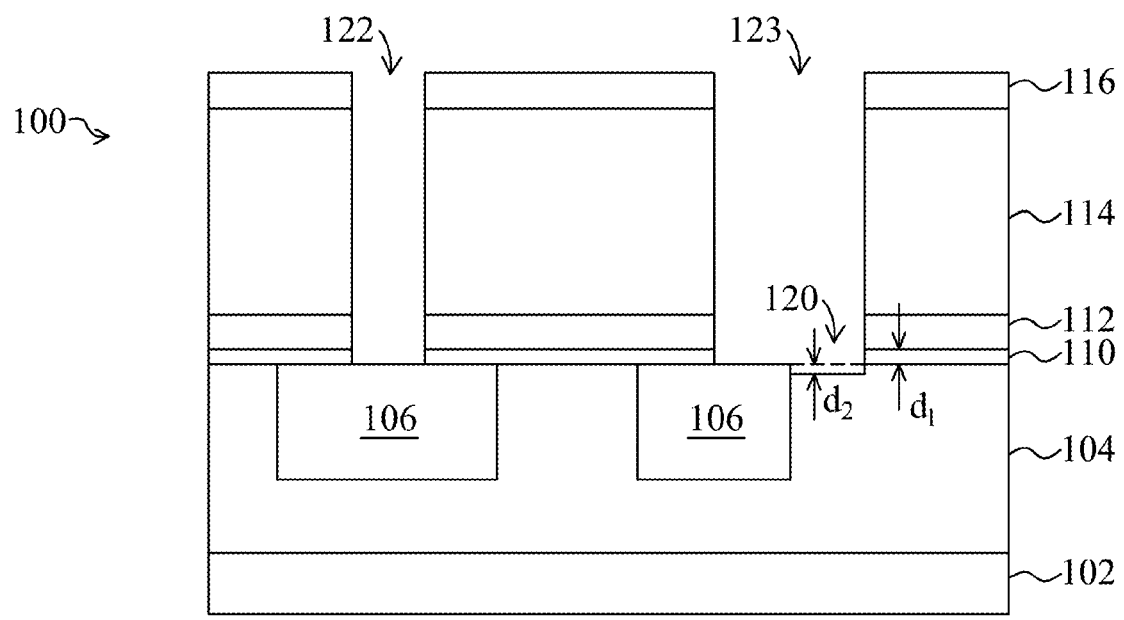

Next, insulating material layer 114 is patterned using a lithography process, using etch stop layers 112 and 110 as an etch stop, as shown in FIGS. 3, 4, and 5. For example, a layer of photoresist 118 may be deposited over the hard mask 116, as shown in FIG. 3. The layer of photoresist 118 is patterned using lithography with a desired pattern for insulating material layer 114, as shown in FIG. 4. The layer of photoresist 118 may be patterned by exposing the layer of photoresist 118 to energy transmitted through or reflected from a lithography mask having a desired pattern thereon. The layer of photoresist 118 is developed, and then exposed or unexposed portions (depending on whether the photoresist 118 is positive or negative) of the photoresist 118 are ashed or etched away. The hard mask 116 or the hard mask 116 and insulating material layer 114 are then exposed to an etch process, removing portions of the hard mask 116 or the hard mask 116 and insulating material layer 114 not covered by the layer of photoresist 118. Portions of the etch stop layers 112 and 110 are also removed during the etch process, as shown in FIG. 5. The layer of photoresist 118 is then removed, also shown in FIG. 5.

In some embodiments, the hard mask 116 is not included. The insulating material layer 114 is patterned using the layer of photoresist 118 as an etch mask during the etch process in these embodiments, for example. In other embodiments, the hard mask 116 is included, and only the hard mask 116 is patterned using the layer of photoresist 118 as an etch mask. The layer of photoresist 118 is then removed, and the hard mask 116 is used as an etch mask while portions of insulating material layer 114 are etched away. The hard mask 116 is left remaining in the structure in some embodiments. In other embodiments, the hard mask 116 is removed before subsequent manufacturing process steps of the semiconductor device 100. In yet other embodiments, the layer of photoresist 118 and also the hard mask 116 are used as an etch mask during the etch process that is used to pattern the insulating material layer 114, as another example.

The etch stop layers 112 and 110 function as endpoint detectors in the etch process used to pattern the insulating material layer 114. The chemicals in the chamber the semiconductor device 100 is placed in for the etch process may be monitored to detect one or more components of the etch stop layers 112 and 110, for example. When the one or more components of the etch stop layers 112 and 110 are detected, the etch process is discontinued, for example. The thickness comprising dimension $d_1$ of etch stop layer 110 may be selected so that substantially all of etch stop layer 110 is removed when the etch process reaches the etch stop layer 110, for example, in some embodiments. In other embodiments, the endpoint detection system or method may involve monitoring chemicals of the etch process to detect when one or more components of etch stop layer 110 ceases to be detected, upon which point the etch process is discontinued, as another example. Alternatively, other types of endpoint detection methods may be used to determine when the etch stop layers 112 and 110 have been reached, indicating that the etch process for the insulating material layer 114 should be discontinued.

In accordance with some embodiments, etch stop layer 112 has a lower etch selectivity with respect to the insulating material layer 114 than etch stop layer 110. Thus, the entire thickness of the etch stop layer 112 is removed in the patterned regions. Etch stop layer 110 has a high etch selectivity with respect to the material of the material insulating material layer 114 and also to the etch stop layer 112 in some embodiments, advantageously.

Patterns 122 and 123 formed in the insulating material layer 114 may comprise fully landed patterns 122 and partially landed patterns 123 in some embodiments, as shown in FIG. 5. The patterns 122 and 123 comprise patterns for conductive vias of the semiconductor device 100 in some embodiments, for example. Alternatively, the patterns 122 and 123 may comprise patterns for other conductive features, such as conductive lines. The fully landed pattern 122 is formed directly over a top surface of one of the conductive features 106. The fully landed pattern 122 comprises an opening in the insulating material layer 114, in the etch stop layer 112, and in the etch stop layer 110 over a top surface of a conductive feature 106. In some embodiments, all of the patterns are fully landed.

The partially landed pattern 123 comprises an opening in the insulating material layer 114, in the etch stop layer 112, and in the etch stop layer 110 over a portion of a top surface of a conductive feature 106 and also over a portion of a top surface of insulating material layer 104. In some embodiments, all of the patterns are partially landed. A recess 120 may be formed in the partially landed pattern 123 due to a slight over-etch of insulating material layer 104 during the etch process used to form the patterns 122 and 123 in the insulating material layer 114, for example. Because the etch stop layer 110 has a high etch selectivity with respect to the material of insulating material layer 104, a depth of the recess 120 comprising dimension $d_2$ is advantageously minimized. Dimension $d_2$ comprises about 50 Å or less in accordance with some embodiments; however, dimension $d_2$ may alternatively comprise other values. In some embodiments, no recess 120 is formed. Dimension $d_2$ comprises zero in those embodiments, for example.

Figure 6:
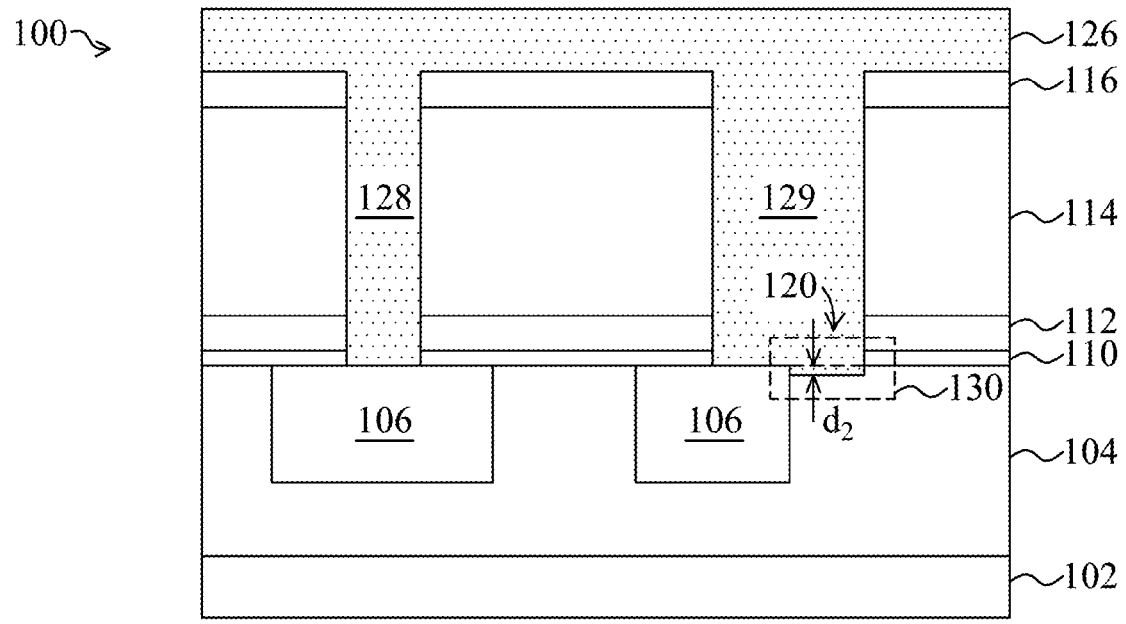

Referring next to FIG. 6, a conductive material 126 is deposited or formed over the patterned insulating material layer 114 and hard mask 116, if the hard mask 116 is included. The conductive material 126 comprises copper, a copper alloy, a conductive liner, a seed layer, or combinations or multiple layers thereof, as examples. The conductive material 126 may be sputtered on, or formed by CVD, PVD, or plating, as examples. Alternatively, the conductive material 126 may comprise other materials and may be formed using other methods. The conductive material 126 fills the patterns in the insulating material layer 114, the etch stop layer 112, and the etch stop layer 110, forming conductive features 128 and 129 within the insulating material layer 114. In some embodiments, the conductive features 128 and 129 comprise vias 128 and 129 that are electrically coupled to the underlying conductive features 106 within insulating material layer 104. In region 130 where the recess 120 in the upper portion of insulating material layer 104 resides, the conductive material 126 also fills the recess 120. Advantageously, the amount of conductive material 126 that fills the recess 120 is minimized due to the minimized size of the recess 120 by the use of the novel etch stop layer 110 having the high etch selectivity. In some embodiments, a portion of a partially landed conductive feature 129 is disposed below a top surface of the first insulating material layer by about 50 Angstroms or less and fills the recess 120, for example. The formation of voids in the upper portion of insulating material layer 104 within the conductive material 126 in the recess 120 is advantageously avoided, due to the minimized or reduced size of the recess 120 or due to the avoidance of the formation of a recess 120 in accordance with some embodiments of the present disclosure.

The fabrication process for the semiconductor device 100 is then continued. The conductive material 126 residing on the top surface of the hard mask 116 may be patterned to form conductive lines, or a chemical-mechanical polishing (CMP) process may be used to remove the conductive material 126 from the top surface of the hard mask 116, leaving conductive features comprising the vias 128 and 129 formed within the insulating material layer 114. Additional material layers (not shown) may be formed over the semiconductor device 100, and individual integrated circuits may be singulated from the semiconductor device 100 and later packaged in single packages, multi-chip packages, or directly mounted in an end application (also not shown).

Figure 7:
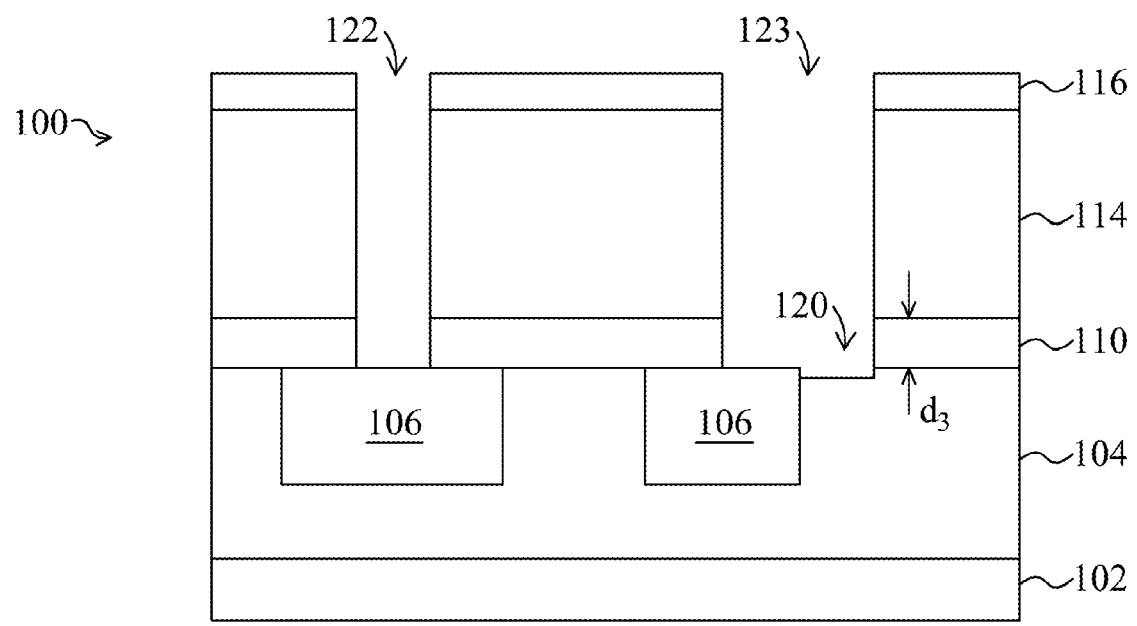
FIG. 7 is a cross-sectional view of a semiconductor device in accordance with some embodiments.

FIG. 7 is a cross-sectional view illustrating a semiconductor device 100 in accordance with some embodiments of the present disclosure. The manufacturing process flow for the semiconductor device 100 is similar to the process flow of described for FIGS. 1 through 6; however, etch stop layer 112 is not included in the material stack. For example, etch stop layer 110 comprises a single etch stop layer 110 that is disposed between insulating material layer 104 and insulating material layer 114. Etch stop layer 110 comprises a similar material described for etch stop layer 110 of the previous embodiments, for example. The etch stop layer 110 has a thickness comprising dimension $d_3$, wherein dimension $d_3$ comprises about 10 Å to about 100 Å in the embodiments shown in FIG. 7, for example. The etch stop layer 110 comprises an etch selectivity to a material layer of the workpiece 102, such as insulating material layers 104 or 114, of about 10 to about 200 in some of the embodiments shown in FIG. 7, for example. In other embodiments, the etch stop layer 110 comprises an etch selectivity to a material layer of the workpiece 102 of greater than about 4 to about 30, as another example. The inclusion of the novel etch stop layer 110 having the high selectivity advantageously minimizes the depth of the recess 120 or avoids a formation of the recess 120 in the top surface of insulating material layer 104 in a partially landed via pattern 123.

Figure 8:
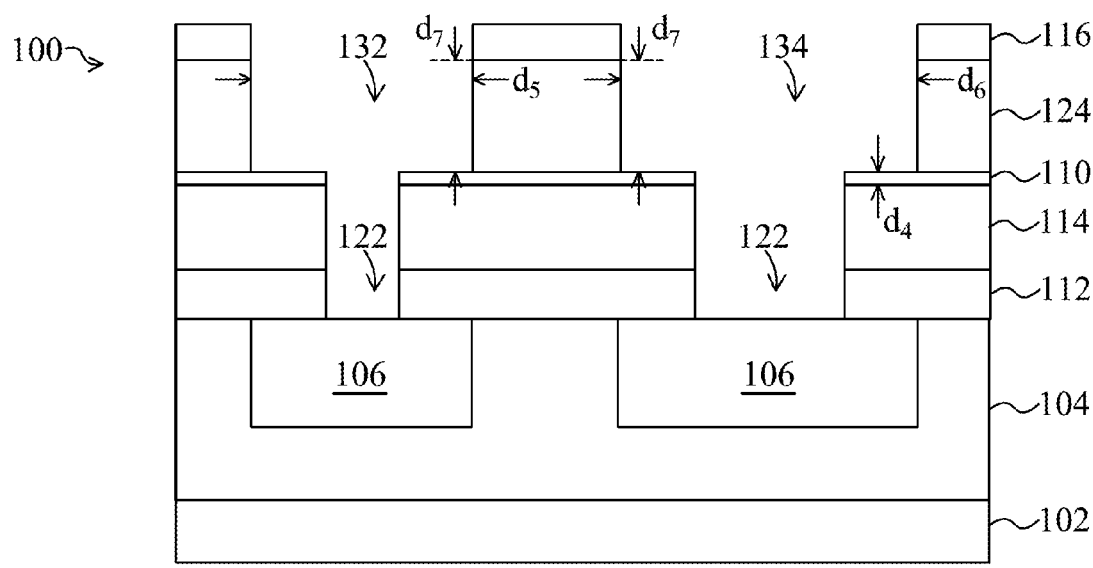
FIGS. 8 and 9 are cross-sectional views of a semiconductor device at various stages of manufacturing in accordance with some embodiments.
Figure 9:
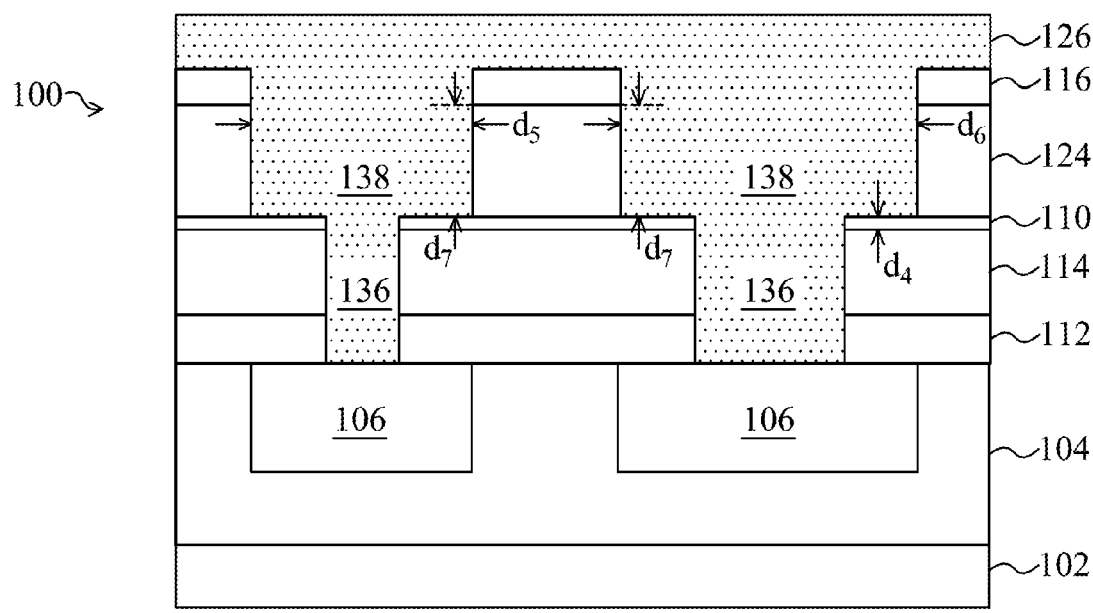

FIGS. 8 and 9 are cross-sectional views illustrating a method of manufacturing a semiconductor device 100 in accordance with other embodiments of the present disclosure. The etch stop layer 110 having the high selectivity to a material layer of the workpiece 102, such as insulating material layers 114 or 124, is included between insulating material layer 114 and insulating material layer 124 in these embodiments. Insulating material layer 124 comprises a similar material and dimension as described herein for insulating material layers 104 and 114, for example. Insulating material layer 124 may comprise the same material, or a different material, than insulating material layers 104 and 114, for example. Etch stop layer 110 is disposed above etch stop layer 112 in the material stack. Insulating material layers 114 and 124 may comprise a single insulating material layer 114/124, for example, and the etch stop layer 110 is placed within the single insulating material layer 114/124. The etch stop layer 110 comprises a thickness of dimension $d_4$, wherein dimension $d_4$ comprises about 10 Å to about 100 Å in the embodiments shown in FIGS. 8 and 9. Alternatively, the etch stop layer 110 may comprise other dimensions. The etch stop layer 110 has an etch selectivity of about 10 to about 200 to insulating material layer 114 and/or 124 in the embodiments shown in FIGS. 8 and 9 in some embodiments. In other embodiments, etch stop layer 110 has an etch selectivity to a material layer of the workpiece of greater than about 4 to about 30. Etch stop layer 112 is disposed over insulating material layer 104 and conductive features 106, beneath insulating material layer 114. Etch stop layer 110 has an etch selectivity that is about 10 times greater than the etch selectivity of etch stop layer 112.

The insulating material layers 114 and 124 are patterned using one or more lithography processes to form via patterns 122 in insulating material layer 114 and conductive line patterns 132 and 134 in insulating material layer 124. Etch stop layer 112 is used as an etch stop to pattern insulating material layer 114, and etch stop layer 110 is used as an etch stop to pattern insulating material layer 124, for example, in a dual damascene patterning process. Etch stop layer 110 has a high selectivity to the insulating material 114 and/or 124, improving the uniformity of the patterns 132 and 134 formed in insulating material layer 124. For example, some patterns 132 may comprise a smaller width comprising dimension $d_5$ than other patterns 134 have a larger width comprising dimension $d_6$. The inclusion of the high selectivity etch stop layer 110 results in both patterns 132 and 134 having substantially a same depth comprising dimension $d_7$, advantageously improving the uniformity of the height or thickness of patterns 132 and 134 across the surface of the semiconductor device 100.

A conductive material 126 is formed over the semiconductor device 100, as shown in FIG. 9. Excess portions of the conductive material 126 are removed from over the top surface of the hard mask 116 using a chemical-mechanical polishing (CMP) process. Narrow patterns 132 and wide patterns 134 form conductive lines 138 that have substantially the same height or depth comprising dimension $d_7$ on the semiconductor device 100 due to the inclusion of the etch stop layer 110, advantageously. The lower portion of the patterns 122 in etch stop layer 110, insulating material layer 114, and etch stop layer 112 form vias 136 that are coupled to conductive features 106 formed within underlying insulating material layer 104.

Figure 10:
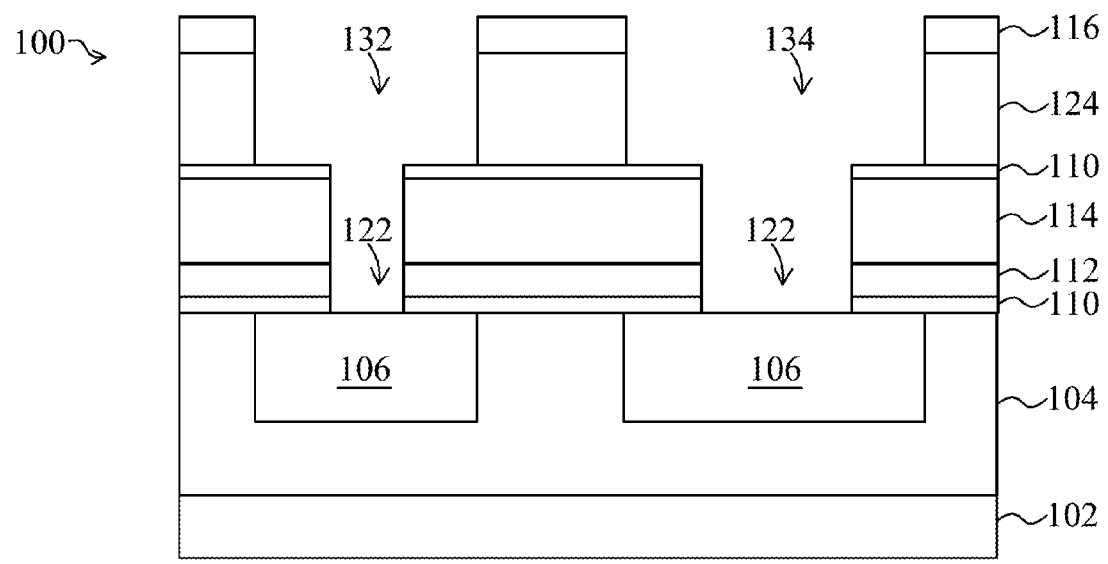
FIGS. 10 and 11 are cross-sectional views of semiconductor devices at various stages of manufacturing in accordance with some embodiments.
Figure 11:
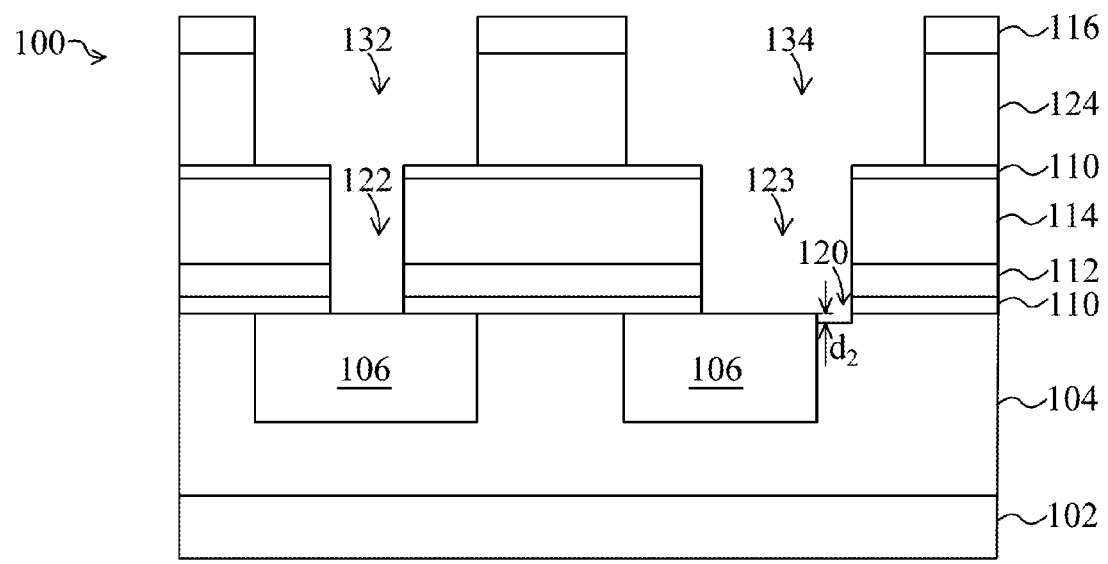

FIGS. 10 and 11 are cross-sectional views of a semiconductor device 100 at various stages of manufacturing in accordance with other embodiments. FIG. 10 illustrates some embodiments wherein etch stop layer 110 is included between insulating material layers 114 and 124 to improve the uniformity of conductive lines formed in insulating material layer 124, similar to the embodiments shown in FIGS. 8 and 9. An etch stop layer 110 is also included beneath etch stop layer 112, similar to the embodiments shown in FIGS. 1 through 6. The etch stop layer 110 disposed beneath etch stop layer 112 comprises an etch selectivity to a material layer of the workpiece 102 of about 10 to about 200 in some embodiments, for example. The via patterns 122 are both fully landed. Including the etch stop layer 110 also beneath etch stop layer 112 reduces the size of a recess 120 in insulating material layer 104 in partially landed via patterns 123, as shown in FIG. 11.

In some embodiments, etch stop layer 112 is not included in the semiconductor device 100, not shown in FIGS. 10 and 11. One of the etch stop layers 110 comprises an etch selectivity to a material layer of the workpiece 102 of greater than about 15 to about 200, and the other of the etch stop layers 110 comprises an etch selectivity to a material layer of the workpiece 102 of about 10 to about 200 in these embodiments, for example. Alternatively, both of the etch stop layers 110 may comprise an etch selectivity of greater than about 4 to about 30.

Figure 12:
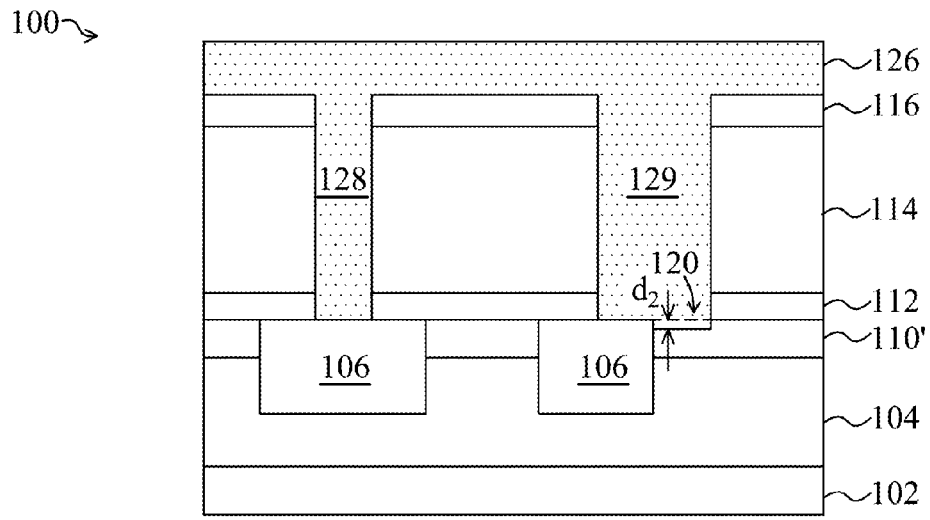
FIG. 12 is a cross-sectional view of a semiconductor device in accordance with some embodiments.

FIG. 12 is a cross-sectional view of a semiconductor device 100 in accordance with some embodiments of the present disclosure. These embodiments are similar to the embodiments shown in FIGS. 1 through 6. However, in FIG. 12, the etch stop layer 110' comprises a high etch selectivity layer having an etch selectivity with respect to a material layer of the workpiece 102 of about 3 to about 20 in some embodiments. The etch stop layer 110' is formed by one or more metal elements that are introduced into a top surface of the insulating material layer 104 by predetermined distance, transforming the top portion of the insulating material layer 104 into the etch stop layer 110' comprising a low etch rate layer that etches at a lower rate than the insulating material layer 104. Etch stop layer 110' comprises a thickness of about 20 Å to about 100 Å in some embodiments, for example. Etch stop layer 110' comprises a material of the insulating material layer 104 combined with one or more metal elements. The etch stop layer 110' comprises a metal compound. The metal compound comprises a metal oxide, a metal nitride, a metal carbide, a metal boride, or combinations thereof. In some embodiments, the metal compound comprises one or more metal elements selected from ruthenium (Ru), nickel (Ni), cobalt (Co), chromium (Cr), iron (Fe), manganese (Mn), titanium (Ti), aluminum (Al), hafnium (Hf), tantalum (Ta), tungsten (W), vanadium (V), molybdenum (Mo), palladium (Pd), or silver (Ag). Etch stop layer 112 comprises a thickness of about 30 Å to about 500 Å, an etch selectivity to a material layer of the workpiece 102 of about 1.5 to about 4, and a material comprising a silicon compound. The silicon compound comprises silicon oxide, a silicon nitride, a silicon carbide, a silicon boride, or combinations thereof. Alternatively, etch stop layer 110' and etch stop layer 112 may comprise other etch selectivities, dimensions, and materials. Etch stop layer 110' comprising the low etch rate layer may be formed by an implantation process of the metal element(s) into the insulating material layer 104, by the introduction of a gas containing the metal element(s), or other methods, for example. The low etch rate etch stop layer 110' reduces via recession at a partially landed via 129 and prevents the formation of a high aspect ratio hole in the underlying insulating material layer 104, advantageously.

Figure 13:
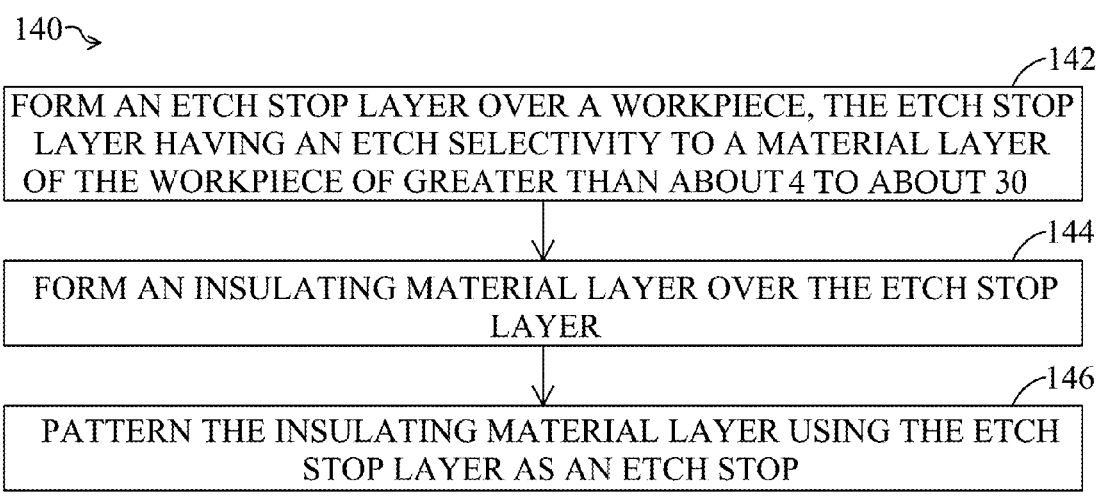
FIG. 13 is a flow chart of a method of manufacturing a semiconductor device in accordance with some embodiments.

FIG. 13 is a flow chart 140 of a method of manufacturing a semiconductor device 100 in accordance with some embodiments. In step 142, an etch stop layer 110 is formed over a workpiece 102 (also see FIG. 3). The etch stop layer 110 has an etch selectivity to a material layer of the workpiece 102 of greater than about 4 to about 30. In step 144, an insulating material layer 114 or 124 is formed over the etch stop layer 110. In step 146, the insulating material layer 114 or 124 is patterned using the etch stop layer 110 as an etch stop (also see FIG. 5).

Advantages of some embodiments of the disclosure include providing novel semiconductor devices 100 and methods of manufacture thereof that include novel etch stop layers 110 and 110' having a high etch selectivity. The etch stop layers 110 and 110' are implementable at the bottom of vias, trenches, and other structures or patterns of semiconductor devices 100. The etch stop layers 110 and 110' reduce trench depth variation and control trench height precisely. The novel etch stop layers 110 and 110' have an etch selectivity that is about 10 times higher than conventional etch stop layers used in semiconductor manufacturing processes in some embodiments.

The etch stop layers 110 and 110' also prevent or reduce recesses 120 from forming in the underlying insulating material layers 104 at un-landed or partially landed vias. Over-etching of portions of via trenches that are not landed on a conductive feature 106 is avoided or reduced, resulting in shallower recesses 120 or resulting in the prevention of the formation of recesses 120. The formation of high-aspect ratio recesses at un-landed vias is avoided, the formation of which could cause gap-fill problems and conductive line or dielectric material reliability problems. For example, if a deep recess 120 forms in an insulating material layer 104 at a partially landed via pattern 123 (see FIG. 5), filling the pattern 123 with a conductive material 126 (see FIG. 6) can become a challenge, possibly resulting in a void in the conductive material 126 within the recess 120, which can cause a reliability failure for the semiconductor device 100.

The etch stop layers 110 and 110' also reduce etch loading effects. For example, non-uniformities of patterns having different dimensions or located at different positions on a semiconductor wafer is prevented by including the etch stop layer 110 and 110' within an insulating material layer 114/124 as an etch stop (see FIG. 8). Varied trench height across a surface of a semiconductor wafer is avoided by the use of the novel etch stop layers 110 and 110'. Implementing the etch stop layer 110 and 110' in some applications prevents variations in trench height for patterns having different widths, resulting in patterns having substantially the same height (e.g., see dimension $d_7$ in FIGS. 8 and 9). Furthermore, the etch stop layers 110 and 110' reduce conductive line resistivity variation of semiconductor devices 100 due to the decreased non-uniformity of patterns.

The novel high selectivity etch stop layers 110 and 110' can be implemented in a bi-layer structure with an additional etch stop layer 112 that comprises a material conventionally used as an etch stop material, as shown in FIGS. 1 through 6, or the novel etch stop layers 110 may replace conventional etch stop layers, as shown in FIG. 7. The etch stop layers 110 can also be positioned in the middle of an insulating material layer 114/124, i.e., for use in dual damascene structures or manufacturing processes, as shown in FIG. 8. The etch stop layers 110 and 110' can also be used in combinations of these locations and applications. In addition, the novel etch stop layer 110 and 110' structures and designs are easily implementable in manufacturing process flows.

In accordance with some embodiments of the present disclosure, a method of manufacturing a semiconductor device includes forming an etch stop layer over a workpiece, the etch stop layer having an etch selectivity to a material layer of the workpiece of greater than about 4 to about 30. The method includes forming an insulating material layer over the etch stop layer, and patterning the insulating material layer using the etch stop layer as an etch stop.

In accordance with other embodiments, a method of manufacturing a semiconductor device includes forming a first insulating material layer over a workpiece, and forming a first etch stop layer over the first insulating material layer. The first etch stop layer has a first etch selectivity to the first insulating material. The method includes forming a second etch stop layer over the first insulating material layer. The second etch stop layer has a second etch selectivity to the first insulating material. The first etch selectivity is different than the second etch selectivity. A second insulating material layer is formed over the second etch stop layer, and the second insulating material layer is patterned using the first etch stop layer as an etch stop. In some embodiments, the method comprises first, forming the first etch stop layer, and second, forming the second etch stop layer. In other embodiments, the method comprises first, forming the second etch stop layer, and second, forming the first etch stop layer.

In accordance with other embodiments, a semiconductor device includes a first insulating material layer disposed over a workpiece, and an etch stop layer disposed over the first insulating material layer. The etch stop layer has an etch selectivity to the first insulating material layer of greater than about 4 to about 30. A second insulating material layer is disposed over the etch stop layer. A plurality of conductive features is disposed in the second insulating material layer. A bottom region of one of the plurality of conductive features disposed in the second insulating material layer is disposed proximate a top surface of the first insulating material layer.

In an embodiment, a semiconductor device is provided. The semiconductor device includes a first insulating material layer disposed over a workpiece, a conductive feature in the first insulating material layer, a first etch stop layer disposed over the first insulating material layer, a second etch stop layer disposed over the first etch stop layer, and a second insulating material layer disposed over the second etch stop layer, wherein the first etch stop layer has a first etch rate selectivity to the second insulating material layer, wherein the second etch stop layer has a second etch rate selectivity to the second insulating material layer, the first etch rate selectivity being greater than the second etch rate selectivity. A conductive interconnect is disposed in the second insulating material layer, wherein the conductive interconnect is electrically coupled to the conductive feature.

In yet another embodiment, a semiconductor device is provided. The semiconductor device includes a first insulating layer, a first conductive feature and a second conductive feature in the first insulating layer, a first etch stop layer over the first insulating layer, the first etch stop layer having an etch selectivity to the first insulating layer of greater than about 4 to about 30, a second etch stop layer on the first etch stop layer, the second etch stop layer having an etch selectivity to the first etch stop layer of 10 to 200, an second insulating layer over the second etch stop layer, and a first conductive element extending through the second insulating layer to the first conductive feature and a second conductive element extending through the second insulating layer to the second conductive feature.

In yet another embodiment, a semiconductor device is provided. The semiconductor device includes a first insulating material layer disposed over a workpiece, the first insulating material layer having a first conductive element therein, a first etch stop layer disposed over the first insulating material layer, the first etch stop layer having a first etch selectivity to the first insulating material layer of greater than about 4 to about 30, and a second etch stop layer disposed over the first etch stop layer, the second etch stop layer having a second etch selectivity to the first insulating material layer, the second etch selectivity being less than the first etch selectivity. A second insulating material layer is disposed over the second etch stop layer, and a second conductive element disposed in the second insulating material layer, the second conductive element being electrically coupled to the first conductive element.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device comprising:
   a first insulating material layer disposed over a workpiece;
   a conductive feature in the first insulating material layer;
   a first etch stop layer disposed directly on the first insulating material layer;
   a second etch stop layer disposed directly on the first etch stop layer;
   a second insulating material layer disposed over the second etch stop layer, wherein the first etch stop layer has a first etch rate selectivity to the second insulating material layer, wherein the second etch stop layer has a second etch rate selectivity to the second insulating material layer, the first etch rate selectivity being greater than the second etch rate selectivity; and
   a conductive interconnect disposed in the second insulating material layer, wherein the conductive interconnect is electrically coupled to the conductive feature, wherein the conductive interconnect extends a first distance along a sidewall of the conductive feature.

2. The semiconductor device of claim 1, wherein the first etch rate selectivity is 4 to 30.

3. The semiconductor device of claim 1, wherein the first etch rate selectivity is about ten times the second etch rate selectivity.

4. The semiconductor device of claim 1, wherein the second etch rate selectivity is 1.5 to 4.

5. The semiconductor device of claim 1, wherein the first distance is less than 50 Å.

6. The semiconductor device of claim 1, wherein the conductive feature extends through the first etch stop layer.

7. The semiconductor device of claim 1, wherein the first distance is less than 50 Å.

8. A semiconductor device comprising:
   a first insulating layer;
   a first conductive feature and a second conductive feature in the first insulating layer;
   a first etch stop layer over the first insulating layer, the first etch stop layer physically contacting the first insulating layer, the first etch stop layer having an etch selectivity to the first insulating layer of greater than about 4 to about 30;
   a second etch stop layer on and physically contacting the first etch stop layer, the second etch stop layer having an etch selectivity to the first insulating layer of less than about 4;
   an second insulating layer over the second etch stop layer; and
   a first conductive element extending through the second insulating layer to the first conductive feature and a second conductive element extending through the second insulating layer to the second conductive feature.

9. The semiconductor device of claim 8, wherein the first conductive element extends along a sidewall of the first conductive feature for a first distance, and wherein the second conductive element is fully landed on the second conductive feature.

10. The semiconductor device of claim 9, wherein the first distance is about 50 Å or less.

11. The semiconductor device of claim 8, wherein the first insulating layer or the second insulating layer comprises a dielectric constant of less than about 3.9.

12. The semiconductor device of claim 8, wherein the first etch stop layer comprises a metal compound comprising a metal oxide, a metal nitride, a metal carbide, a metal boride, or combinations thereof.

13. The semiconductor device of claim 12, wherein the metal compound comprises one or more metal elements selected from ruthenium (Ru), nickel (Ni), cobalt (Co), chromium (Cr), iron (Fe), manganese (Mn), titanium (Ti), aluminum (Al), hafnium (Hf), tantalum (Ta), tungsten (W), vanadium (V), molybdenum (Mo), palladium (Pd), or silver (Ag).

14. A semiconductor device comprising:

a first insulating material layer disposed over a workpiece, the first insulating material layer having a first conductive element therein;

a first etch stop layer disposed over the first insulating material layer, wherein the first conductive element extends to an uppermost surface of the first etch stop layer, the first etch stop layer having a first etch selectivity to the first insulating material layer of greater than about 4 to about 30;

a second etch stop layer disposed over the first etch stop layer, the second etch stop layer having a second etch selectivity to the first insulating material layer, the second etch selectivity being less than the first etch selectivity;

a second insulating material layer disposed over the second etch stop layer; and a second conductive element disposed in the second insulating material layer, the second conductive element being electrically coupled to the first conductive element.

15. The semiconductor device of claim 14, wherein the second conductive element is disposed over and is partially landed on first conductive element.

16. The semiconductor device of claim 14, wherein a portion of the second conductive element is disposed below a top surface of the first conductive element by about 50 Å or less.

17. The semiconductor device of claim 14, wherein a thickness of the first etch stop layer is between 5 Å and 100 Å.

18. The semiconductor device of claim 14, wherein the first insulating material layer or the second insulating material layer comprises a dielectric constant of less than about 3.9.

19. The semiconductor device of claim 1, wherein the first etch stop layer extends at least partially over an upper surface of the conductive feature, and wherein the conductive interconnect extends into the first insulating material layer.

20. The semiconductor device of claim 19, wherein the first conductive feature extends through the first etch stop layer.

* * * * *